United States Patent
Hwang

(10) Patent No.: US 9,543,372 B2
(45) Date of Patent: *Jan. 10, 2017

(54) ORGANIC LIGHT EMITTING DIODE DISPLAY

(71) Applicant: SAMSUNG DISPLAY CO., LTD., Yongin, Gyeonggi-Do (KR)

(72) Inventor: Young-In Hwang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/687,983

(22) Filed: Apr. 16, 2015

(65) Prior Publication Data

US 2015/0221711 A1    Aug. 6, 2015

Related U.S. Application Data

(63) Continuation of application No. 13/051,753, filed on Mar. 18, 2011, now Pat. No. 9,013,461.

(30) Foreign Application Priority Data

Mar. 18, 2010  (KR) .................. 10-2010-0024422
Mar. 17, 2011  (KR) .................. 10-2011-0023871

(51) Int. Cl.
*G09G 5/00* (2006.01)
*G06F 3/038* (2013.01)
*H01L 27/32* (2006.01)

(52) U.S. Cl.
CPC ....... *H01L 27/3276* (2013.01); *H01L 27/3258* (2013.01); *H01L 27/3279* (2013.01)

(58) Field of Classification Search
CPC ............. H01L 27/3258; H01L 27/3276; H01L 27/3279

See application file for complete search history.

(56) References Cited

U.S. PATENT DOCUMENTS

| | | | |
|---|---|---|---|
| 5,352,543 A | 10/1994 | Ryu | |
| 2006/0187384 A1 | 8/2006 | Hisatake | |
| 2009/0085477 A1 | 4/2009 | Hwang et al. | |
| 2009/0218925 A1* | 9/2009 | Kwak | H01L 27/3276 313/243 |
| 2010/0045576 A1* | 2/2010 | Park | H01L 51/5281 345/76 |

FOREIGN PATENT DOCUMENTS

| | | |
|---|---|---|
| KR | 10-2003-0058911 A | 7/2003 |
| KR | 10-2006-0057945 A | 5/2006 |
| KR | 10-2007-0050792 A | 5/2007 |
| KR | 10-2009-0056865 A | 6/2009 |

* cited by examiner

*Primary Examiner* — Kumar Patel
*Assistant Examiner* — Insa Sadio
(74) *Attorney, Agent, or Firm* — Lee & Morse, P.C.

(57) ABSTRACT

An organic light emitting diode (OLED) display including a substrate main body; a driving circuit on the substrate main body; an organic light emitting element on the driving circuit; and a front substrate covering the organic light emitting element and coupled to the substrate main body, wherein the driving circuit includes a wire, the wire including a planar portion parallel to a surface of the substrate main body, and a connection portion connected to the planar portion and extending in a direction orthogonal to the substrate main body.

19 Claims, 3 Drawing Sheets

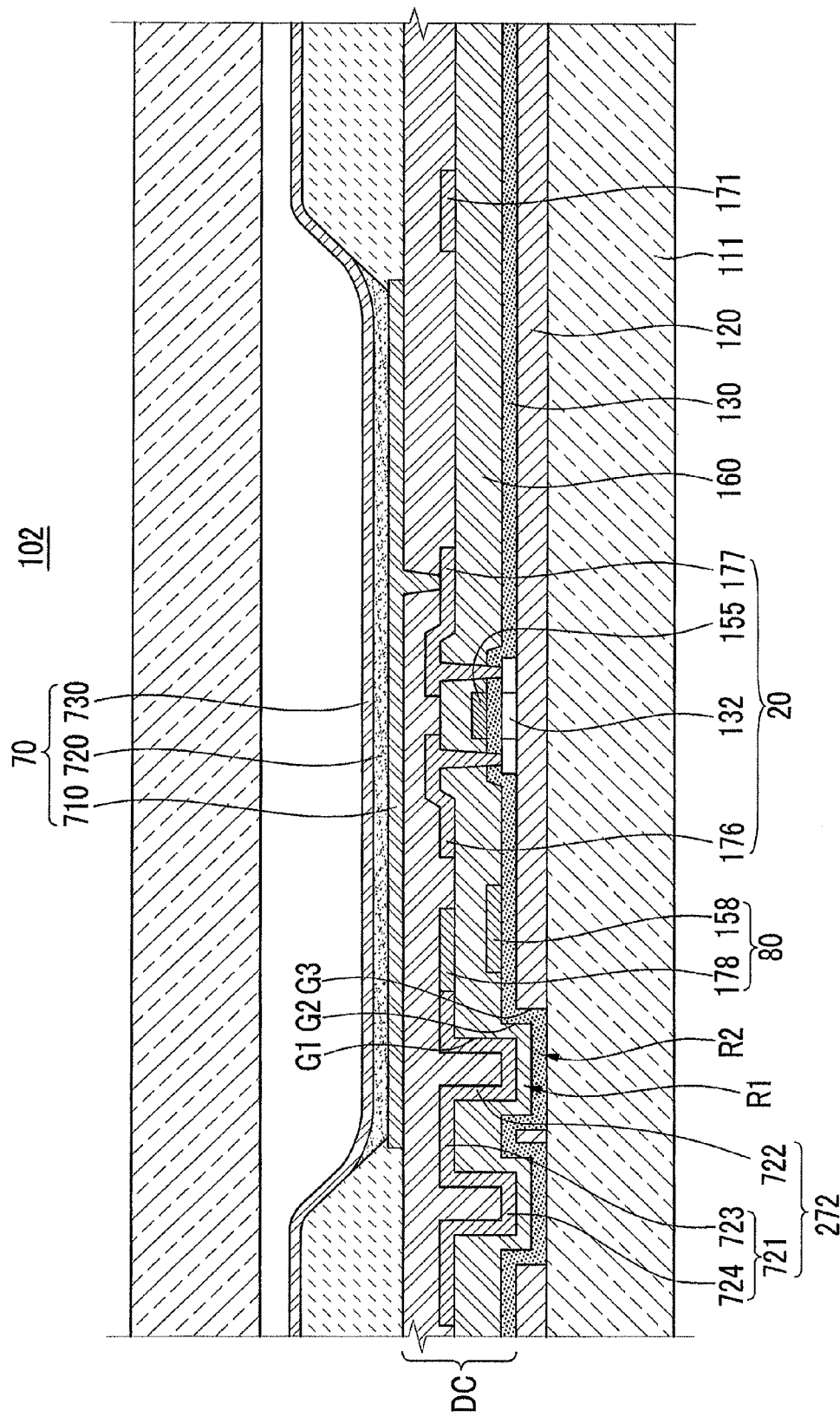

ORGANIC LIGHT EMITTING DIODE DISPLAY

CROSS REFERENCE TO RELATED APPLICATION

This is a continuation application based on pending application Ser. No. 13/051,753, filed Mar. 18, 2011, the entire contents of which is hereby incorporated by reference.

BACKGROUND

1. Field

Embodiments relate to an organic light emitting diode (OLED) display.

2. Description of the Related Art

An organic light emitting diode (OLED) display is a self emissive display device that displays images with organic light emitting diodes. The organic light emitting diode emits light by way of energy generated when excitons, being combinations of electrons and holes, within an organic emission layer fall from an excited state to a ground state. Thus, the OLED display displays an image using the light.

The organic light emitting diode (OLED) display may include a switching thin film transistor, a driving thin film transistor, and a capacitor. A common drain voltage Vdd may be applied to a driving source electrode of the driving thin film transistor. The driving drain electrode may be applied with a common source voltage Vss. A current flowing in the organic light emitting element may be controlled by the magnitude of data voltage Vdata applied to the driving gate electrode through the switching thin film transistor.

In order to emit uniform light from the organic light emitting diode (OLED) display, the common drain voltage Vdd should be applied with uniform voltage. However, as the common drain power line (hereinafter, "a common power line") applying the common drain voltage (Vdd, hereinafter, "a common voltage") is elongated, the line resistance may be increased, and thus a voltage drop (IR drop) may be generated.

Therefore, the common voltage may be changed according to a position of the common power line such that the same current may not flow to all driving thin film transistors even though one data voltage is applied. The organic light emitting element in which the light emitting degree is determined according to the current may not emit light of a uniform luminance.

Accordingly, consideration of the voltage drop may be important as a size of the organic light emitting diode (OLED) display is increased.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting diode (OLED) display, which represents advances over the related art.

It is a feature of an embodiment to provide an OLED display having a wire that is disposed on a substrate main body and exhibits low resistance.

The embodiments may be realized by providing an organic light emitting diode (OLED) display including a substrate main body; a driving circuit on the substrate main body; an organic light emitting element on the driving circuit; and a front substrate covering the organic light emitting element and coupled to the substrate main body, wherein the driving circuit includes a wire, the wire including a planar portion parallel to a surface of the substrate main body, and a connection portion connected to the planar portion and extending in a direction orthogonal to the substrate main body.

The driving circuit may include a switching thin film transistor connected to a gate line and a data line, the gate line and data line intersecting each other and being insulated from each other, a storage capacitor connected to the switching thin film transistor and a common power line, the common power line being insulated from the gate line and the data line, and a driving thin film transistor connected to the switching thin film transistor, the storage capacitor, the common power line, and the organic light emitting element, and the wire may be a common power line.

The organic light emitting diode (OLED) display may further include an interlayer insulation layer and a gate insulator layer on the substrate main body, wherein the storage capacitor includes capacitor plates, the capacitor plates being insulated from one another by the interlayer insulation layer, the driving thin film transistor includes a gate electrode, the gate electrode being insulated by the gate insulator layer in a thickness direction thereof, and the connection portion is disposed on an inner side surface of a hole in the interlayer insulation layer and the gate insulator layer.

The interlayer insulation layer and the gate insulator layer may include a plurality of holes therein, and the common power line may include a plurality of connection portions, the plurality of connection portions being respectively disposed on inner side surfaces of the plurality of holes.

The planar portion may include a first planar portion on the interlayer insulation layer, and a second planar portion on an inner surface of the substrate main body in the hole, the second planar portion being connected to the first planar portion by the connection portion.

The organic light emitting diode (OLED) display may further include an interlayer insulation layer on the substrate main body, wherein the storage capacitor includes capacitor plates, the capacitor plates being insulated from one another by the interlayer insulation layer, the interlayer insulation layer includes a first groove therein, and the connection portion is disposed on an inner side surface of the at least one first groove in the interlayer insulation layer.

The organic light emitting diode (OLED) display may further include a gate insulation layer on the substrate main body, wherein the driving thin film transistor includes a gate electrode, the gate electrode being insulated by the gate insulator layer in a thickness direction thereof, and the interlayer insulation layer includes at least one first corresponding portion, the at least one first corresponding portion forming the first groove and being formed on an inner surface of a second groove in the gate insulator layer.

The organic light emitting diode (OLED) display may further include a buffer layer on an inner surface of the substrate main body, wherein the gate insulation layer includes a second corresponding portion, the second corresponding portion forming the second groove and being formed on an inner surface of a third groove in the buffer layer, and the inner surface of the substrate main body.

The interlayer insulation layer may include a plurality of the first grooves therein, the gate insulator layer may include a plurality of the second grooves therein, the buffer layer may include a plurality of the third grooves therein, and the common power line may include a plurality of connection portions, the plurality of connection portions being respectively disposed on inner surfaces of the first grooves and being connected to each other through the planar portion.

The planar portion may include a first planar portion on the interlayer insulation layer, and a second planar portion on an inner bottom surface of the first groove, the second planar portion being connected to the first planar portion by the connection portion.

The embodiments may also be realized by providing an organic light emitting diode (OLED) display including a lower structure including a first portion that is substantially flat and a second portion that has a different height than the first portion; a driving circuit on the lower structure, the driving circuit having at least one wire; an organic light emitting element on the driving circuit; and an upper structure on the organic light emitting element, wherein the at least one wire is continuously disposed on the first and second portions and including at least one step.

The driving circuit may include a switching thin film transistor connected to a gate line and a data line, the gate line and data line intersecting each other and being insulated from each other, a storage capacitor connected to the switching thin film transistor and a common power line, the common power line being insulated from the gate line and the data line, and a driving thin film transistor connected to the switching thin film transistor, the storage capacitor, the common power line, and the organic light emitting element, and the wire may be a common power line.

The first portion may correspond to the first insulating material, and the second portion may correspond to the second insulating material.

The lower structure may include a first insulating material; and a second insulating material on the first insulating material. The lower structure may also be a unitary structure.

The first insulating material may include a glass substrate and may be a unitary structure.

The second insulating material may be a unitary structure.

The first portion may correspond to the first insulating material, and the second portion may correspond to the second insulating material.

The lower structure may be a unitary structure.

BRIEF DESCRIPTION OF THE DRAWINGS

The above and other features and advantages will become more apparent to those of ordinary skill in the art by describing in detail exemplary embodiments with reference to the attached drawings, in which:

FIG. 3 illustrates a cross-sectional view of an organic light emitting diode (OLED) display according to another embodiment.

DETAILED DESCRIPTION

Korean Patent Application No. 10-2010-0024422 filed on Mar. 18, 2010, and Korean Patent Application No. 10-2011-0023871 filed on Mar. 17, 2011, in the Korean Intellectual Property Office, and entitled: "Organic Light Emitting Diode Display," are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
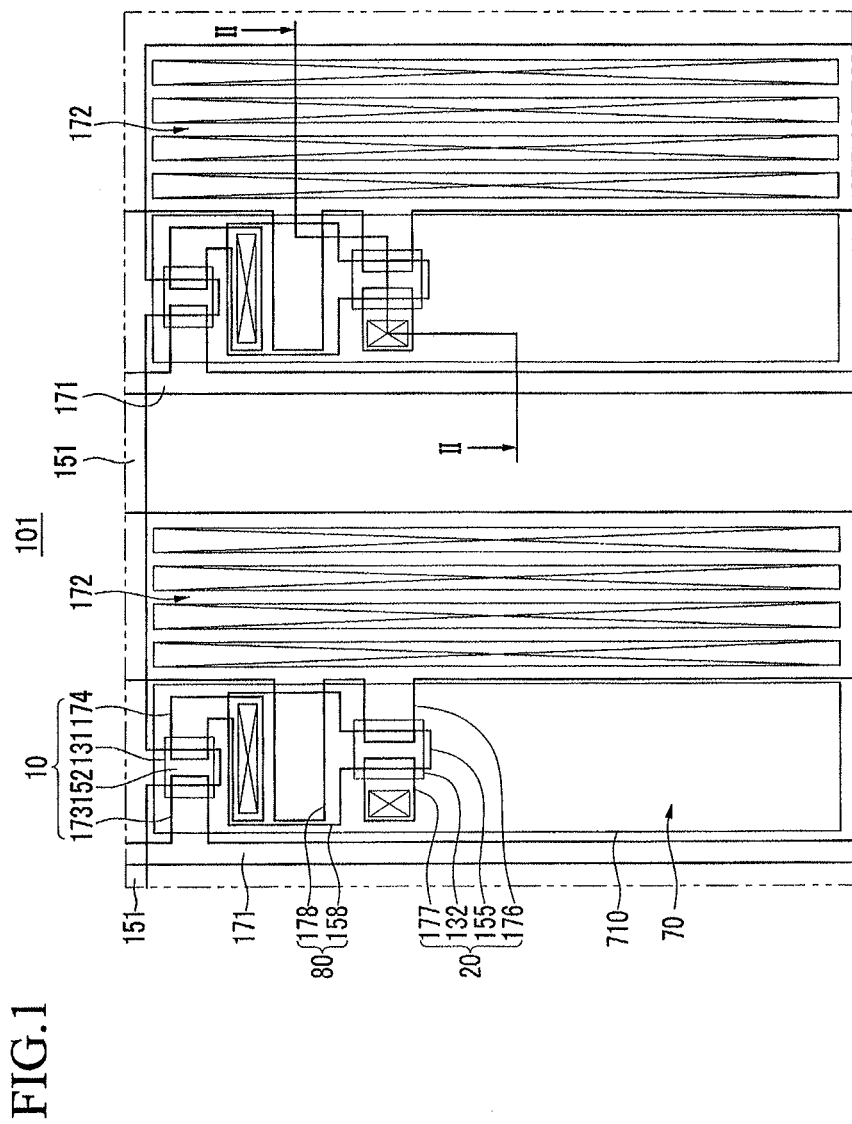
FIG. 1 illustrates a layout view of a pixel circuit of an organic light emitting diode (OLED) display according to an embodiment.
Figure 2:
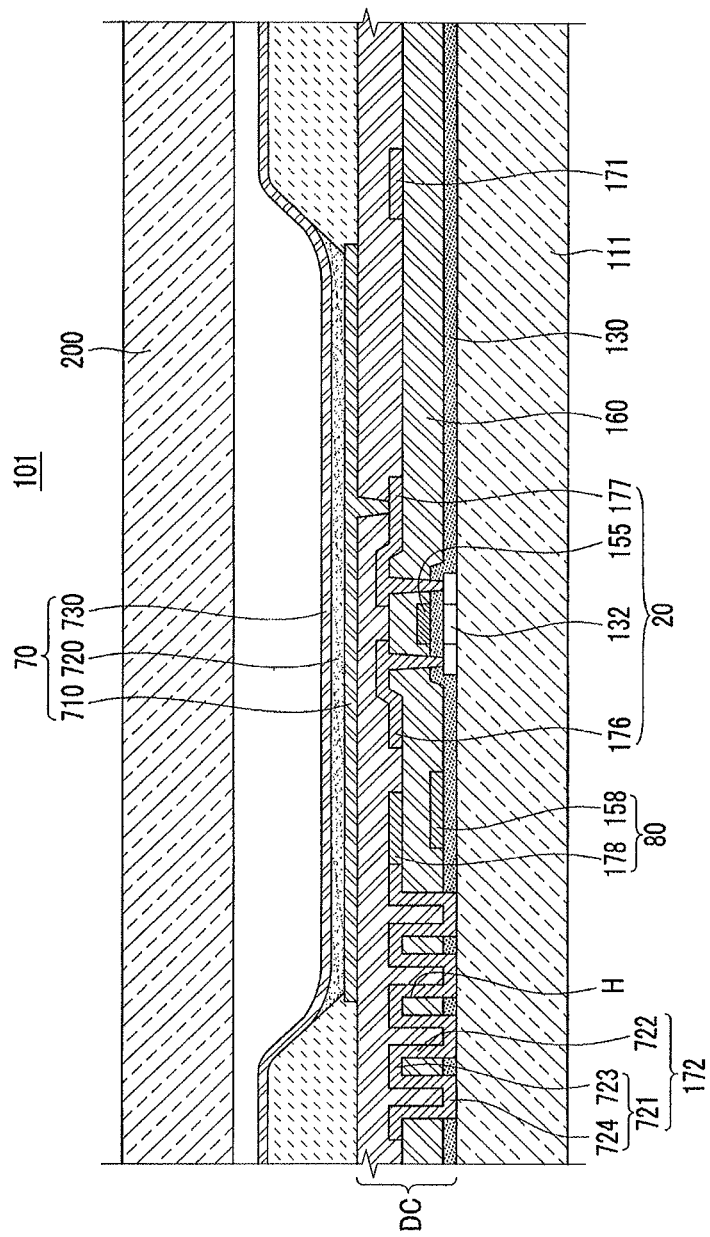
FIG. 2 illustrates a cross-sectional view taken along line II-II of FIG. 1.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout FIG. 1 illustrates a layout view of a pixel circuit of an organic light emitting diode (OLED) display according to an embodiment. FIG. 2 illustrates a cross-sectional view taken along the line II-II of FIG. 1. Referring to FIG. 1 and FIG. 2, an organic light emitting diode (OLED) display 101 according to an embodiment may include a substrate main body 111, a driving circuit DC, an organic light emitting element 70, and a front substrate 200.

The substrate main body 111 may be formed as an insulating substrate made of, e.g., glass, quartz, ceramic, plastic, or the like, or as a flexible substrate made of, e.g., plastic or the like. In an implementation, the substrate main body 111 may be formed as a metallic substrate made of, e.g., stainless steel or the like.

The driving circuit DC and the organic light emitting element 70 may be formed on the substrate main body 111. The driving circuit DC may include thin film transistors 10 and 20 and may drive the organic light emitting element 70. The organic light emitting element 70 may emit light according to a driving signal transmitted from the driving circuit DC.

The front substrate 200 may be coupled to the substrate main body 111 on the organic light emitting element 70, thereby protecting the driving circuit DC and the organic light emitting element 70.

An inner structure of the organic light emitting diode (OLED) display 101 will now be described. FIG. 1 and FIG. 2 illustrate an active matrix (active matrix, AM) organic light emitting diode (OLED) display 101 having a 2Tr-1Cap structure in which one pixel includes two thin film transistors (TFT) 10 and 20 and one capacitor 80.

However, the embodiments are not limited thereto. Accordingly, the organic light emitting diode display 101 may be provided with three or more thin film transistors and two or more storage capacitors in one pixel and may be configured to have various structures with additional wires. Herein, the pixel represents a base unit for displaying an image and is disposed in each pixel area. The organic light emitting diode display 101 displays an image through a plurality of pixels.

As illustrated in FIG. 1 and FIG. 2, a switching thin film transistor 10, a driving thin film transistor 20, a storage capacitor 80, and an organic light emitting diode (OLED) 70 may be formed on the substrate main body 111 for each pixel.

Herein, a configuration including the switching thin film transistor 10, the driving thin film transistor 20, and the storage capacitor 80 is referred to as a driving circuit DC. In addition, a buffer layer 120 may be further formed between the substrate main body 111 and the driving circuit DC and the organic light emitting element 70 (referring to FIG. 3). The buffer layer 120 may have a single-layer structure of e.g., silicon nitride ($SiN_x$), or a dual-layer structure of, e.g., silicon nitride ($SiN_x$) and silicon oxide ($SiO_2$). The buffer layer 120 may prevent penetration of harmful and/or unnecessary elements, e.g. impurity atoms or moisture, and may planarize the surface. However, the buffer layer 120 may not be required, and may be omitted according to the type and process conditions of the substrate main body 111 (referring to FIG. 2).

In addition, at least one wire is disposed on the substrate main body 111. That is, the substrate main body 111 may further include a gate line 151 disposed in one direction, a data line 171 insulated from and crossing the gate line 151, and a common power supply line 172 (referring to FIG. 1). The common power line may intersect the data line (not shown). Herein, one pixel may be defined by boundaries of the gate line 151, the data line 171, and the common power supply line 172, but is not limited thereto.

The organic light emitting diode 70 may include a first electrode 710, an organic emission layer 720 on the first electrode 710, and a second electrode 730 on the organic emission layer 720. Holes and electrodes may be injected into the organic emission layer 720 from each of the first electrode 710 and the second electrode 730. When excitons generated by combination of the injected holes and electrons in the organic emission layer return from an excited state to a ground state, light is emitted.

The storage capacitor 80 may include a pair of capacitor plates 158 and 178 with an interlayer insulating layer 160 interposed therebetween. Herein, the interlayer insulating layer 160 may function as a dielectric. Storage capacity may be determined by electric charges stored in the storage capacitor 80 and a voltage difference between the capacitor plates 158 and 178.

The switching thin film transistor 10 may include a switching semiconductor layer 131, a switching gate electrode 152, a switching source electrode 173, and switching drain electrode 174. The driving thin film transistor 20 may include a driving semiconductor layer 132, a driving gate electrode 155, a driving source electrode 176, and a driving drain electrode 177.

The switching thin film transistor 10 may serve as a switching element that selects a desired pixel to emit light. The switching gate electrode 152 may be connected to the gate line 151. The switching source electrode 173 may be connected to the data line 171. The switching drain electrode 174 may be disposed away from the switching source electrode 173 and may be connected to either capacitor plate (158 in this case).

The driving thin film transistor 20 may apply driving power to the pixel electrode 710 in order to allow the organic emission layer 720 of the organic light emitting diode 70 to emit light in the selected pixel. The driving gate electrode 155 may be connected to the capacitor plate 158 connected to the switching drain electrode 174. Each of the driving source electrode 176 and the other capacitor plate 178 may be connected to the common power supply line 172. The driving drain electrode 177 may be connected to the pixel electrode 710 of the organic light emitting diode 70 through a contact hole.

By this structure, the switching thin film transistor 10 may be operated by a gate voltage applied to the gate line 151 to transmit a data voltage applied to the data line 171 to the driving thin film transistor 20. A voltage corresponding to a difference between a common voltage applied to the driving thin film transistor 20 from the common power supply line 172 and the data voltage transmitted from the switching thin film transistor 10 may be stored in the storage capacitor 80 and a current corresponding to the voltage stored in the storage capacitor 80 may flow to the organic light emitting diode 70 through the driving thin film transistor 20 to allow the organic light emitting diode 70 to emit light.

However, the structure of the thin film transistors 10 and 20 and the organic light emitting element 70 is not limited to the examples illustrated FIG. 1 and FIG. 2. That is, the structure of the thin film transistors 10 and 20 and organic light emitting element 70 may be modified within the scope in which a person skilled in the art may easily implement the OLED.

The common power line 172 may be connected to the driving source electrode 176 of the driving thin film transistor 20, thereby applying the common voltage to the first electrode 710 of the organic light emitting element 70 through the driving thin film transistor 20. In the present embodiment, the common power line 172 may reduce resistance against the common voltage for uniform current to be supplied to the organic light emitting elements 70.

In particular, the common power line 172 may include a planar portion 721 parallel to a surface of the substrate main body 111 and a connection portion 722 connected in a thickness direction (i.e., substantially perpendicular to the surface of the substrate main body 111 or an up and down direction of FIG. 2) of the substrate main body 111 at ends of the planar portion 721. Also, the planar portion 721 and the connection portion 722 may form a pattern connected according to a length direction of the common power line 172. That is, when widths of the planar portions 721 are equal to each other, the connection portion 722 may increase a width of the entire line of the common power line 172.

A hole H may be integrally formed in the interlayer insulation layer 160 and the gate insulator layer 130 in a thickness direction thereof. The hole H may form a pattern such that the interlayer insulation layer 160 is connected to the gate insulator layer 130 according to a length direction of the common power line 172. The hole H pattern may be formed during a process of forming a contact hole in the interlayer insulation layer 160 to connect the driving semiconductor layer 132 to the driving source electrode 176 and the driving drain electrode 177 such that an additional process may not be required. The gate insulator layer 130 may be formed on an inner surface of the driving semiconductor layer 132 and the substrate main body 111 such that the driving semiconductor layer 132 and the gate electrode 155 are insulated from each other.

The planar portion 721 may include a first planar portion 723 on the interlayer insulation layer 160 and a second planar portion 724 on an inner surface of the substrate main body 111 in the hole H. The connection portion 722 may be disposed on an inner surface of the hole H, thereby connecting the first and second planar portions 723 and 724 to each other and thus forming an entire line width of the common power line 172.

That is, the common power line 172 may be formed by adding the line width of the connection portion 722 to the line width of the first and second planar portions 723 and 724. In an implementation, a plurality of holes H may be disposed in the interlayer insulation layer 160 and the gate insulator layer 12 and the connection portion 722 may be respectively formed on inner surfaces of the holes H such that a plurality of connection portions 722 are connected to each other through the first and second planar portions 723 and 724. To form the common power line 172, a number of connection portions 722 may be increased as a number of holes H is increased in a predetermined range. Thus, the line width of the common power line 172 may be increased and resistance of the common voltage may be reduced.

Although a common power line was taken as an example of a wire in the above descriptions, wires other than the common power line that are disposed on the substrate main body may be formed to be similar to the common power line in order to lower their resistance, if necessary.

Next, another embodiment will be described in comparison with the previous embodiment. Description of like configurations is omitted and different configurations will be described.

FIG. 3 illustrates a cross-sectional view of an organic light emitting diode (OLED) display according to another embodiment. The organic light emitting diode (OLED) display 102 of the present embodiment may further include the buffer layer 120 between the substrate main body 111 and the gate insulator layer 130. In this case, the buffer layer 120 may be formed on the substrate main body 111 and a portion corresponding to the connection portion 722 and the second planar portion 724 of a common power line 272 may be patterned.

The connection portion 722 may be formed on an inner surface of a first groove G1 in the interlayer insulation layer 160. The interlayer insulation layer 160 may include a first corresponding portion R1 forming the first groove G1, and the first corresponding portion R1 may be formed on an inner surface of a second groove G2 formed in the gate insulator layer 130. The gate insulator layer 130 may include a second corresponding portion R2 forming the second groove G2. The second corresponding portion R2 may be formed on an inner surface of the third groove G3 formed in the buffer layer 120 on an inner surface of the substrate main body 111 and on the inner surface of the substrate main body 111.

In an implementation, a plurality of first groove G1 may be formed in the interlayer insulation layer 160, a plurality of second grooves G2 may be formed in the gate insulator layer 130, and a plurality of third grooves G3 may be formed in the buffer layer 120. Further, the connection portion 722 may be formed on an inner surface of the first groove G1, thereby connecting to the planar portion 721. The planar portion 721 may include the first and second planar portions 723 and 724.

The first planar portion 723 may be formed on the interlayer insulation layer 160 and the second planar portion 724 may be formed on an inner surface of the first groove G1. The first and second planar portions 723 and 724 may be connected to each other by the connection portion 722. Accordingly, to form the common power line 272, the connection portion 722 may increase the entire line width of the common power line 722 in the predetermined range. Thus, resistance of the common voltage may be reduced. The width of the first and second planar portions 723 and 724 may be the same as the predetermined range to form the common power line 272.

A wire having low resistance may be developed, however the low resistance wire may require material development and process development. According to an embodiment, the common power line may include the planar portion and the connection portion that increase the line width of the common power line such that the resistance of the common voltage may be reduced. Thus, a drop of the common voltage may be prevented in the common power line.

Accordingly, a relatively lower voltage may be applied as the common voltage such that the power consumption may be advantageously reduced. Also, luminance deviation of the organic light emitting element may be beneficially reduced.

When providing the common voltage having the same resistance, the width of the common power line may be reduced by the connection portion, and thus the aperture ratio may be increased and the design space may be obtained.

The substrate main body may comprise a multi-layered insualting material or a single-layered insulating material. In addition, the substrate main body may be a single-layered insulating material, and another insulating material may be disposed between the substrate main body and the driving circuit.

When two insulating materials are disposed under the driving circuit, they may be referred to as a first insulating material and a second insulating material, respectively. Here, the second insulating material may be disposed on the first insulating material, and the driving circuit may be disposed on the second insulating material.

All of the elements disposed under the driving circuit may be commonly referred to as a lower structure. Similarly, all of the elements disposed on the organic light emitting element may be commonly referred to as an upper structure.

Here, the lower structure comprises a first portion and a second portion, and the second portion has a height different from that of the first portion. Further, at least one wire is continuously disposed on the first and second portions and includes at least one step.

When the first and second insulating materilas are disposed under the driving circuit, the first portion of the lower structure corresponds to the first insulating material, and the second portion of the lower structure corresponds to the second insulating material.

In the above, the first insulating material may include a glass substrate.

Alternatively, the substrate main body, the interlayer insulation layer, the gate insulation layer, and the buffer layer may each be unitary structures, and may be patterned using half tone masks.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
    a pixel;
    a first layer having a first surface and a first groove extending along a first direction from the first surface;
    a first transistor in the pixel; and
    a wire connected to the first transistor,
    wherein the wire includes first and second connection portions each extending in the first direction from the first surface of the first layer into the first groove, the first and second connection portions being separated by an insulating material in a second direction crossing the first direction in the first groove, and first and second planar portions extending in the second direction, wherein the first planar portion contacts one of the the first and second connection portions on the first surface of the first layer and the second planar portion contacts the first and second connection portions to electrically connect them in the first groove in the first layer, and wherein the wire does not penetrate the first layer.

2. The display as claimed in claim 1, wherein the first layer is an interlayer insulation layer.

3. The display as claimed in claim 2, wherein the interlayer insulation layer is on a gate of the first transistor.

4. The display as claimed in claim 2, wherein the interlayer insulation layer extends between plates of a capacitor of the pixel.

5. The display as claimed in claim 2, wherein the first connection portion and the second connection portion are at least partially on an inner side surface of the first groove.

6. The display as claimed in claim 1, wherein the first layer is a gate insulation layer of the first transistor.

7. The display as claimed in claim 1, wherein the first layer is a buffer layer that extends under the first transistor.

8. The display as claimed in claim 1, wherein the wire is a power wire connected to an organic light emitting diode of the pixel.

9. The display as claimed in claim 1, wherein only one side of each of the first connection portion and the second connection portion are at least partially on the first layer in the first groove.

10. The display as claimed in claim 9, wherein the only one side is an outer side which is at least partially on an inner surface of the first groove.

11. The display as claimed in claim 1, wherein the first transistor is a driving transistor of the pixel.

12. An organic light emitting diode (OLED) display, comprising:
a pixel;
a first layer including a first groove;
a second layer including a second groove;
a first transistor in the pixel; and
a wire connected to the first transistor,
wherein the wire includes first and second connection portions extending in a first direction and a first planar portion extending in a second direction crossing the first direction,
wherein at least the first planar portion is in the first groove in the first layer, and
wherein the first groove extends into the second groove.

13. The display as claimed in claim 12, wherein:
the first groove is in an interlayer insulation layer of the first transistor, and
the second groove is in a gate insulation layer of the first transistor.

14. The display as claimed in claim 12, further comprising:
a third layer including a third groove,
wherein the second groove extends into the third groove.

15. The display as claimed in claim 14, wherein:
the first groove is in an interlayer insulation layer of the first transistor,
the second groove is in a gate insulation layer of the first transistor, and
the third groove is in a buffer layer that extends under the first transistor.

16. An organic light emitting diode (OLED) display, comprising:
a pixel;
a first layer;
a first transistor in the pixel; and
a wire connected to the first transistor,
wherein the wire includes first and second connection portions extending in a first direction and a first planar portion extending in a second direction crossing the first direction,
wherein at least the first planar portion is in a first groove in the first layer, and
wherein the wire has a width which includes a distance between first and second surfaces of at least one of the first or second connection portions.

17. The display as claimed in claim 16, wherein a width of the wire includes a sum of:
a first distance between opposing surfaces of at least one of the first or second connection portions, and
a second distance corresponding to a thickness of the first planar portion.

18. An organic light emitting diode (OLED) display, comprising:
a pixel;
a first layer;
a first transistor in the pixel; and
a wire connected to the first transistor,
wherein:
the wire includes a plurality of first and second connection portions extending in a first direction and a plurality of first planar portions extending in a second direction crossing the first direction,
the pluralities of the first and second connection portions and first planar portions forming a predetermined pattern having a thickness greater than a thickness of each of the first connection portion, the second connection portion, and the first planar portion, and
at least the first planar portion is in a first groove in the first layer.

19. The display as claimed in claim 18, wherein the predetermined pattern is substantially a square wave pattern.

* * * * *